(12) United States Patent
Yamamoto et al.

(10) Patent No.: US 6,593,835 B1
(45) Date of Patent: Jul. 15, 2003

(54) MULTIPLE-TUNING CIRCUIT OF TUNER PREVENTING SELECTION CHARACTERISTIC DETERIORATION

(75) Inventors: Masaki Yamamoto, Fukushima-ken (JP); Akira Yamamoto, Aomori-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/712,499

(22) Filed: Nov. 14, 2000

(30) Foreign Application Priority Data

Nov. 25, 1999  (JP) ............................. 11-334947

(51) Int. Cl.[7] ................................................ H03J 3/26
(52) U.S. Cl. ............................................ 334/1; 334/15
(58) Field of Search ........................................ 334/1, 15

(56) References Cited

U.S. PATENT DOCUMENTS

| | | | |
|---|---|---|---|
| 4,584,544 A | 4/1986 | Hettiger | 333/174 |
| 4,956,710 A | 9/1990 | Pugel | 358/188 |
| 4,972,509 A * | 11/1990 | Maejima | 455/180 |
| 2001/0004229 A1 * | 6/2001 | Yamamoto et al. | 334/15 |

FOREIGN PATENT DOCUMENTS

| | | | |
|---|---|---|---|
| EP | 0 929 153 A1 | 12/1998 | H03J/5/24 |
| JP | Hei 9-284157 | 10/1987 | |
| JP | Hei 7-297740 | 11/1995 | |

\* cited by examiner

*Primary Examiner*—Benny Lee
(74) *Attorney, Agent, or Firm*—Brinks Hofer Gilson & Lione

(57) ABSTRACT

In a secondary tuning circuit, a capacitor is provided between a connection point between a direct-current blocking capacitor and a tuning coil and a connection point between a varactor diode and another direct-current blocking capacitor. The capacitor, another tuning coil and the varactor diode form a trap circuit. As a result, it is possible to prevent a frequency selection characteristic of the multiple-tuning circuit from deteriorating due to an undesired new tuning circuit formed by a static capacitance generated in a non-conductive state of the switch diode.

2 Claims, 5 Drawing Sheets

MULTIPLE-TUNING CIRCUIT OF TUNER PREVENTING SELECTION CHARACTERISTIC DETERIORATION

BACKGROUND OF THE INVENTION

1. Field of the Invention

In general, the present invention relates to a multiple-tuning circuit employed in a tuner capable of switching a tuning frequency among a plurality of frequency bands by turning a switch diode on and off. More particularly, the present invention relates to a multiple-tuning circuit employed in a tuner capable of preventing a frequency selection characteristic thereof from deteriorating due to an undesired new tuning circuit formed by a static capacitance generated in a non-conductive state of a switch diode.

2. Description of the Related Art

A multiple-tuning circuit employed in the conventional tuner is explained by referring to FIGS. 4, 5, 6 and 7. As shown in FIG. 5, the tuning circuit comprises a primary tuning circuit 51 and a secondary tuning circuit 52. The first tuning circuit 51 includes a series circuit of a direct-current-blocking capacitor 53 and a varactor diode 54. The first tuning circuit 51 also includes another series circuit of a tuning coil 55 for high-band reception, a tuning coil 56 for low-band reception, a resistor 57, a coupling coil 58 and a direct-current-blocking capacitor 59, which are connected to each other in an order shown in that figure. The series circuit and the other series circuit form a parallel circuit. The anode and the cathode of the varactor diode 54 are connected to the ground and the direct-current-blocking capacitor 53 respectively. The other terminal of the direct-current-blocking capacitor 59 is also connected to the ground. The connection point between the direct-current-blocking capacitor 53 and the tuning coil 55 for high-band reception serves as an input terminal of the multiple-tuning circuit. This input terminal is connected to a high-frequency amplifier 60 at the preceding stage.

A series circuit comprising a direct-current blocking capacitor 61, a switch diode 62 and a direct-current blocking capacitor 63 is connected between the connection point between the tuning coil 55 for high-band reception and the tuning coil 56 for low-band reception and the ground. In this series circuit, the anode and the cathode of the switch diode 62 are connected to the direct-current-blocking capacitor 61 and the direct-current-blocking capacitor 63 respectively.

The connection point between the direct-current-blocking capacitor 61 and the switch diode 62 is connected to a switch terminal HB 65 for high-band reception through a power-feeding resistor 64.

The connection point between the switch diode 62 and the direct-current-blocking capacitor 63 is connected to a switch terminal LB 67 for low-band reception through a power-feeding resistor 66.

In addition, the connection point between the switch diode 62 and the direct-current-blocking capacitor 63 is connected to ground through a bias resistor 68.

The connection point between the varactor diode 54 and the direct-current-blocking capacitor 53 is connected to a tuning-voltage terminal TU 70 through a power-feeding resistor 69.

The second tuning circuit 52 includes a parallel circuit comprising a varactor diode 71 and a series circuit. The series circuit comprises a tuning coil 72 for high-band reception, a tuning coil 73 for low-band reception, a resistor 74, a direct-current-blocking capacitor 75, the coupling coil 58 and the direct-current-blocking capacitor 59, which are connected to each other in an order shown in the figure. The anode and the cathode of the varactor diode 71 are connected to the ground and the tuning coil 72 for high-band reception respectively. The connection point between the varactor diode 71 and the tuning coil 72 for high-band reception is connected to a series circuit of a varactor diode 76 and a direct-current-blocking capacitor 77. The anode and the cathode of the varactor diode 76 are connected to the direct-current-blocking capacitor 77 and the tuning coil 72 for high-band reception respectively. The other end of the direct-current-blocking capacitor 77 is connected to an output terminal of the multiple-tuning circuit. The output terminal is connected to a mixer 78 at the succeeding stage. In the mixer 78, an oscillation signal generated by an oscillator not shown in the figure is mixed with a signal output by the multiple-tuning circuit to produce an intermediate-frequency signal.

A series circuit of a direct-current blocking capacitor 79 and a switch diode 80 is provided between the connection point of the tuning coils 72 and 73 and the connection between the switch diode 62 and the direct-current-blocking capacitor 63. The anode and the cathode of the switch diode 80 are connected to the direct-current-blocking capacitor 79 and the direct-current-blocking capacitor 63.

The connection point between the direct-current-blocking capacitor 79 and the switch diode 80 is connected to the switch terminal 65 for high-band reception through a power-feeding resistor 81.

On the other hand, the connection point between the direct-current-blocking capacitor 63 and the switch diode 80 is connected to a switch terminal 67 for low-band reception through a power-feeding resistor 66.

The connection point between the tuning coil 72 for high-band reception and the varactor diode 71 is connected to the tuning-voltage terminal TU 70 through a power-feeding resistor 82.

In the configuration described above, when a voltage is applied to the terminal HB 65 for high-band reception, the switch diodes 62 and 80 are each put in a conductive state. In addition, a power supply voltage is supplied from power supply terminal MB. When a voltage is applied to the terminal LB 67 for low-band reception, on the other hand, the switch diodes 62 and 80 are each put in a non-conductive state. In this way, the multiple-tuning circuit can be switched from a high-band reception state to a low-band reception state or vice versa.

By the way, in order to switch the multiple-tuning circuit of a tuner shown in FIG. 5 to a state of reception of high-band television signals each having a frequency in the range 170 MHz to 222 MHz for example, a voltage of typically 5 V is applied to the terminal 65 for high-band reception and no voltage is applied to the terminal 67 for low-band reception. With a voltage of 5 V applied to the terminal 65 for high-band reception, a voltage is applied to the switch diodes 62 and 80 in the forward direction, putting both the switch diodes 62 and 80 in a conductive state. In this conductive state, the connection point between the tuning coil 55 for high-band reception and the tuning coil 56 for low-band reception as well as the connection point between the tuning coil 72 for high-band reception and the tuning coil 73 for low-band reception are connected to the ground. As a result, the varactor diode 54 and the tuning coil 55 for high-band reception in the first tuning circuit 51 form a parallel circuit. Similarly, the varactor diode 71 and the tuning coil 72 for high-band reception in the second tuning circuit 52 also form a parallel circuit as well. A high-frequency equivalent circuit resulting in this state is a multiple-tuning circuit shown in FIG. 6 wherein the direct-current-blocking capacitors and the resistors are ignored. A multiple-tuning circuit is formed by the varactor diode 54, the high-band tuning coil 55, the varactor diode 71, and the high-band tuning coil 72. By adjusting the voltages applied to the varactor diodes 54 and 71, a desired tuning frequency can be obtained.

In order to switch the multiple-tuning circuit of a tuner shown in FIG. 5 to a state of reception of low-band television signals each having a frequency in the range 90 MHz to 108 MHz for example, a voltage of typically 5 V is applied to the terminal 67 for low-band reception and no voltage is applied to the terminal 65 for high-band reception. With a voltage of 5 V applied to the terminal 67 for low-band reception, a voltage is applied to the switch diodes 62 and 80 in the backward direction, putting both the switch diodes 62 and 80 in a non-conductive state. As a result, the varactor diode 54, the tuning coil 55 for high-band reception, the tuning coil 56 for low-band reception and the coupling coil 58 in the first tuning circuit 51 form a parallel tuning circuit, which is referred to hereafter as a main tuning circuit. Similarly, the tuning coil 72 for high-band reception, the tuning coil 73 for low-band reception, the coil 58 and the varactor diode 71 in the second tuning circuit 52 also form a parallel tuning circuit as well. By adjusting the voltages applied to the varactor diodes 54 and 71, a desired tuning frequency can be obtained.

By the way, with the multiple-tuning circuit switched to a state of reception of low-band television signals, a voltage is applied to the switch diodes 62 and 80 in the backward direction. In general, when a voltage is applied to a diode in a backward direction, a capacitance of about 0.2 pF is typically generated between the terminals. If the capacitance generated between the terminals of the switch diode 62 by the voltage applied in the backward direction and the capacitance generated between the terminals of the switch diode 80 by the voltage applied in the backward direction are equivalent to the capacitance of a capacitor 83, a high-frequency equivalent circuit of the multiple-tuning circuit put in this state is a multiple-tuning circuit shown in FIG. 7 wherein the direct-current-blocking capacitors and the resistors are ignored.

In the primary tuning circuit 51, a parallel tuning circuit is formed by the varactor diodes 54, the tuning coils 55 and 56, and the coupling coil 58. In the secondary tuning circuit 52, a parallel tuning circuit is formed by the varactor diode 71, the tuning coils 72 and 73, and the coupling coil 58. These tuning circuits form a main tuning circuit.

As shown in FIG. 7, due to the existence of the capacitor 83, the varactor diode 54, the tuning coil 55 for high-band reception and the capacitor 83 in the first tuning circuit 51 as well as the varactor diode 71, the tuning coil 72 for high-band reception and the capacitor 83 in the second tuning circuit 52 form a new tuning circuit 84 referred to hereafter as a parasitic tuning circuit separately from the main tuning circuit. The tuning frequency of the parasitic tuning circuit 84 is a frequency all but common to the first tuning circuit 51 and the second tuning circuit 52. Assume for example that the desired tuning frequency of the main tuning circuit is 127 MHz. In this case, the tuning frequency of the parasitic tuning circuit 84 appears in an UHF band in the range 600 to 700 MHz.

The reception frequency selection characteristic in the VHF low-band top channel is shown in FIG. 4. Thus, the multiple-tuning circuit in the state of low-band reception exhibits a frequency selection characteristic like one shown by a solid line in FIG. 4. As shown in that figure, the characteristic also has a peak representing a tuning frequency produced by the parasitic tuning circuit 84 as shown in a portion B in the figure beside s a peak representing a tuning frequency produced by the main tuning circuit as shown in a portion A in the figure. A signal having a frequency fine the tuning-frequency range of the parasitic tuning circuit 84 is supplied to a mixer 78, which is connected to the output terminal of this multiple-tuning circuit. The mixer 78 mixes the input signal generated by the parasitic tuning circuit 84 with an oscillation signal to generate a signal with an intermediate frequency in the range 54 MHz to 60 MHz. The mixing process also produces a by-product signal with a frequency equal to a difference between the frequency of the signal in the tuning frequency by the parasitic tuning circuit 84 and N times the frequency of the oscillation signal or equal to a sum of the frequency of the signal in the tuning frequency by the parasitic tuning circuit 84 and N times the frequency of the oscillation signal. This by-product signal serves as a disturbance to the intermediate-frequency signal.

When the desired tuning frequency of the main tuning circuit is 127 MHz for example, the tuning frequency of the oscillation signal is 184 MHz, which is higher than the desired tuning frequency of the main tuning circuit by 57 MHz. The mixer 78 outputs a signal with an intermediate frequency of 57 MHz, which is equal to a difference between the 609-MHz tuning frequency of the input signal generated by the parasitic tuning circuit 84 and a frequency of 552 MHz, which is equal to N times the 184-MHz frequency of the oscillation signal where N=3.

SUMMARY OF THE INVENTION

It is thus an object of the present invention addressing the problems described above to provide a multiple-tuning circuit of a tuner exhibiting a good frequency selection characteristic obtained as a result of eliminating an effect of a new parasitic tuning circuit formed by a static capacitance created by a non-conductive state of a switch diode in a state of low-band reception of the multiple-tuning circuit.

In order to solve the problems described above, the present invention provides a multiple-tuning circuit of a tuner, the circuit comprising a primary tuning circuit and a secondary tuning circuit wherein: the secondary tuning circuit includes: a first varactor diode; a series circuit of a first coil for high-band reception and a second coil for low-band reception, with the series circuit connected in parallel to the first varactor diode; a switch diode connected between the ground and a connection point between the first coil and the second coil; a second varactor diode with an end thereof connected to a connection point between the first coil and the first varactor diode; and a capacitor connected between the other end of the second varactor diode and a connection point between the first coil and the second coil in parallel to a circuit of the second varactor diode and the first coil, the other end of the second varactor diode is used as an output terminal of the multiple-tuning circuit; and the first coil, the second varactor diode and the capacitor form a trap circuit.

In a multiple-tuning circuit of a tuner, the capacitance of the capacitor is set at a value about equal to a capacitance between terminals of the switch diode in a non-conductive state.

DETAILED DESCRIPTION OF THE PREFERRED EMBODIMENT

A preferred embodiment implementing a multiple-tuning circuit of a tuner provided by the present invention is described by referring to FIGS. 1 to 4.

Figure 1:
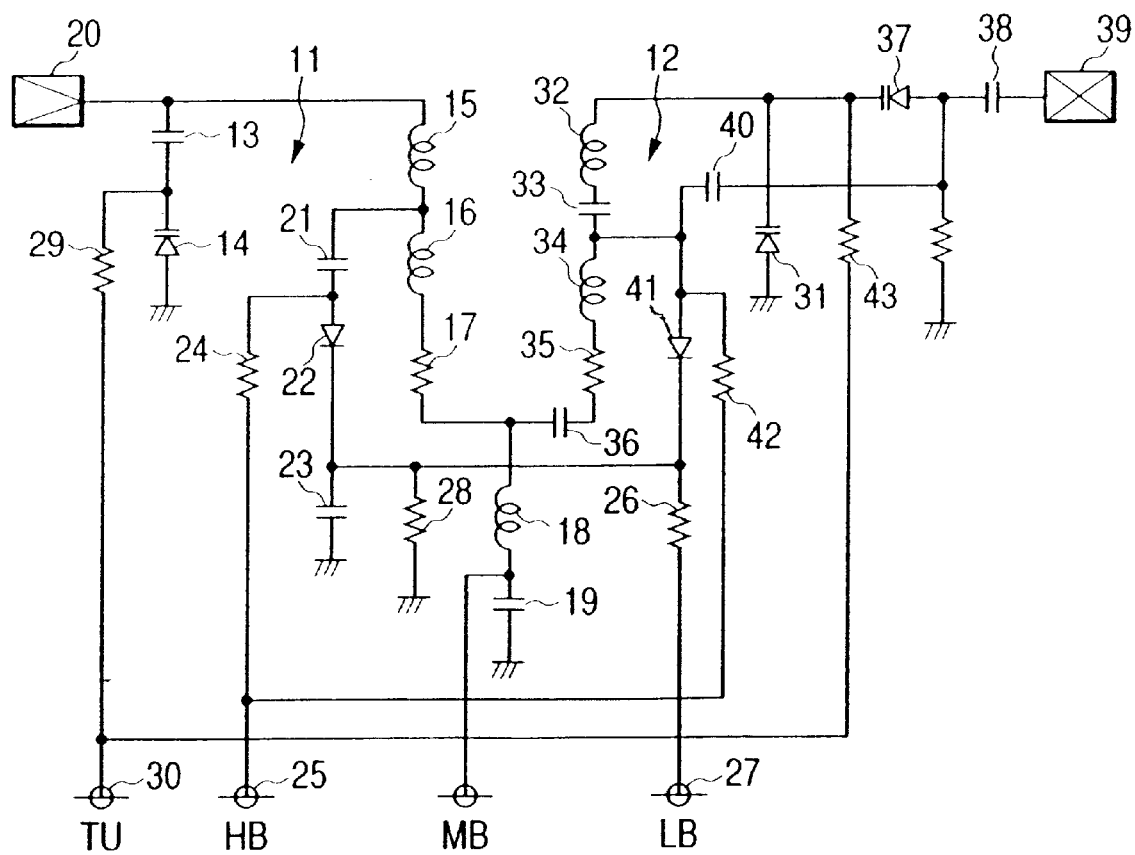
FIG. 1 is a diagram showing a multiple-tuning circuit of a tuner provided by the present invention.

FIG. 1 is a diagram showing a multiple-tuning circuit of a tuner provided by the present invention. As shown in the figure, the tuning circuit comprises a primary tuning circuit 11 and a secondary tuning circuit 12. The first tuning circuit 11 includes a series circuit of a direct-current-blocking capacitor 13 and a varactor diode 14. The first tuning circuit 11 also includes another series circuit of a tuning coil 15 for high-band reception, a tuning coil 16 for low-band reception, a resistor 17, a coupling coil 18 and a direct-current-blocking capacitor 19, which are connected to each other in an order shown in the figure. The series circuit and the other series circuit form a parallel circuit. The anode and the cathode of the varactor diode 14 are connected to the ground and the direct-current-blocking capacitor 13 respectively. The other terminal of the direct-current-blocking capacitor 19 is also connected to the ground. The connection point between the direct-current-blocking capacitor 13 and the tuning coil 15 serves as an input terminal of the multiple-tuning circuit. This input terminal is connected to a high-frequency amplifier 20 at the preceding stage.

A series circuit comprising a direct-current blocking capacitor 21, a switch diode 22 and a direct-current blocking capacitor 23 is connected between the connection point between the tuning coil 15 for high-band reception and the tuning coil 16 for low-band reception and the ground. In this series circuit, the anode and the cathode of the switch diode 22 are connected to the direct-current-blocking capacitor 21 and the direct-current-blocking capacitor 23 respectively.

The connection point between the direct-current-blocking capacitor 21 and the switch diode 22 is connected to a switch terminal HB 25 for high-band reception through a power-feeding resistor 24.

The connection point between the switch diode 22 and the direct-current-blocking capacitor 23 is connected to a switch terminal LB 27 for low-band reception through a power-feeding resistor 26.

In addition, the connection point between the switch diode 22 and the direct-current-blocking capacitor 23 is connected to ground through a bias resistor 28.

The connection point between the varactor diode 14 and the direct-current-blocking capacitor 13 is connected to a tuning-voltage terminal TU 30 through a power-feeding resistor 29.

The second tuning circuit 12 includes a parallel circuit comprising a first varactor diode 31 and a series circuit. The series circuit comprises a first tuning coil 32 for high-band reception, a direct-current-blocking capacitor 33, a second tuning coil 34 for low-band reception, a resistor 35, a direct-current blocking capacitor 36, the coupling coil 18 and the direct-current-blocking capacitor 19, which are connected to each other in an order shown in the figure. The anode and the cathode of the varactor diode 31 are connected to the ground and the tuning coil 32 for high-band reception respectively. The connection point between the varactor diode 31 and the tuning coil 32 for high-band reception is connected to a series circuit of a second varactor diode 37 and a direct-current blocking capacitor 38. The anode and the cathode of the varactor diode 37 are connected to the direct-current-blocking capacitor 38 and the tuning coil 32 for high-band reception respectively. The other end of the direct-current-blocking capacitor 38 is connected to an output terminal of the multiple-tuning circuit. The output terminal is connected to a mixer 39 at the succeeding stage. In the mixer 39, an oscillation signal generated by an oscillator not shown in the figure is mixed with a signal output by the multiple-tuning circuit to produce an intermediate-frequency signal.

A capacitor 40 connects a connection point between the direct-current-blocking capacitor 33 and the tuning coil 34 for high-band reception to a connection point between the varactor diode 37 and the direct-current-blocking capacitor 38.

A switch diode 41 is used to connect a connection point between the direct-current-blocking capacitor 33 and the tuning coil 34 for high-band reception to a connection point between the switch diode 22 and the direct-current-blocking capacitor 23. The anode of the switch diode 41 is connected to the connection point between the direct-current-blocking capacitor 33 and the tuning coil 34 for high-band reception. On the other hand, the cathode of the switch diode 41 is connected to the connection point between the switch diode 22 and the direct-current-blocking capacitor 23.

It should be noted that the capacitance of the capacitor 40 is set at a value about equal to a capacitance between terminals of the switch diode 41 in a non-conductive state.

The anode of the switch diode 41 is connected to a switch terminal HB 25 for high-band reception through a power-feeding resistor 42.

On the other hand, the cathode of the switch diode 41 is connected to a switch terminal LB 27 for low-band reception through a power-feeding resistor 26.

The connection point between the tuning coil 32 for high-band reception and the varactor diode 31 is connected to the tuning-voltage terminal TU 30 through a power-feeding resistor 43. In addition, a power supply voltae is supplied from supply terminal MB.

In the configuration described above, when a voltage is applied to the terminal HB 25 for high-band reception, the switch diodes 22 and 41 are each put in a conductive state. When a voltage is applied to the terminal LB 27 for-low-band reception, on the other hand, the switch diodes 22 and 41 are each put in a non-conductive state. In this way, the multiple-tuning circuit can be switched from a high-band reception state to a low-band reception state or vice versa.

By the way, in order to switch the multiple-tuning circuit of a tuner shown in FIG. 1 to a state of reception of high-band television signals each having a frequency in the range 170 MHz to 222 MHz for example, a voltage of typically 5 V is applied to the terminal 25 for high-band reception and no voltage is applied to the terminal 27 for low-band reception. With a voltage of 5 V applied to the terminal 25 for high-band reception, a voltage is applied to the switch diodes 22 and 41 in the forward direction, putting both the switch diodes 22 and 41 in a conductive state. In this conductive state, the connection point between the tuning coil 15 for high-band reception and the tuning coil 16 for low-band reception as well as the connection point between the direct-current blocking capacitor 33 and the tuning, coil 34 for high-band reception are connected to the ground. As a result, the varactor diode 14 and the tuning coil 15 for high-band reception in the first tuning circuit 11 form a parallel circuit. Similarly, the varactor diode 31 and the tuning coil 32 for high-band reception in the second tuning circuit 12 also form a parallel circuit as well. A high-frequency equivalent circuit resulting in this state is a multiple-tuning circuit shown in FIG. 2 wherein the direct-current-blocking capacitors and the resistors are ignored. By adjusting the voltages applied to the varactor diodes 14 and 31, a desired tuning frequency can be obtained. A multiple-tuning circuit is formed by the varactor diode 14, the high-band tuning coil 15, the varactor diode 31, and the high-band tuning coil 32. In addition, the varactor diode 37 and the capacitor 40 form a trap circuit.

In order to switch the multiple-tuning circuit of a tuner shown in FIG. 1 to a state of reception of low-band television signals each having a frequency in the range 90 MHz to 108 MHz for example, a voltage of typically 5 V is applied to the terminal 27 for low-band reception and no voltage is applied to the terminal 25 for high-band reception. With a voltage of 5 V applied to the terminal 27 for low-band reception, a voltage is applied to the switch diode 22 and the switch diode 41 in the backward direction, putting both the switch diode 22 and the switch diode 41 in a non-conductive state. As a result, the varactor diode 14, the tuning coil 15 for high-band reception, the tuning coil 16 for low-band reception for low-band reception and the coil 18 in the first tuning circuit 11 form a parallel tuning circuit, which is referred to hereafter as a main tuning circuit. Similarly, the tuning coil 32 for high-band reception, the tuning coil 34 for high-band reception, the coil 18 and the varactor diode 31 in the second tuning circuit 12 also form a parallel tuning circuit as well. By adjusting the voltages applied to the varactor diodes 14 and 31, a desired tuning frequency can be obtained.

By the way, with the multiple-tuning circuit switched to a state of reception of low-band television signals, a voltage is applied to the switch diode 22 and the switch diode 41 in the backward direction. In general, when a voltage is applied to a diode in a backward direction, a capacitance of about 0.2 pF is typically generated between the terminals. If the capacitance generated between the terminals of the switch diode 22 by the voltage applied in the backward direction and the capacitance generated between the terminals of the switch diode 41 by the voltage applied in the backward direction are equivalent to the capacitance of the capacitor 44, a high-frequency equivalent circuit of the multiple-tuning circuit put in this state is a multiple-tuning circuit shown in FIG. 3 wherein the direct-current-blocking capacitors and the resistors are ignored.

In the primary tuning circuit 11, a parallel tuning circuit is formed by the varactor diode 14, the tuning coils 15 and 16, and the coupling coil 18. In the secondary tuning circuit 12, a parallel tuning circuit is formed by the varactor diode 31, the tuning coils 32 and 34, and the coupling coil 18. These tuning circuits form a main tuning circuit.

Figure 3:
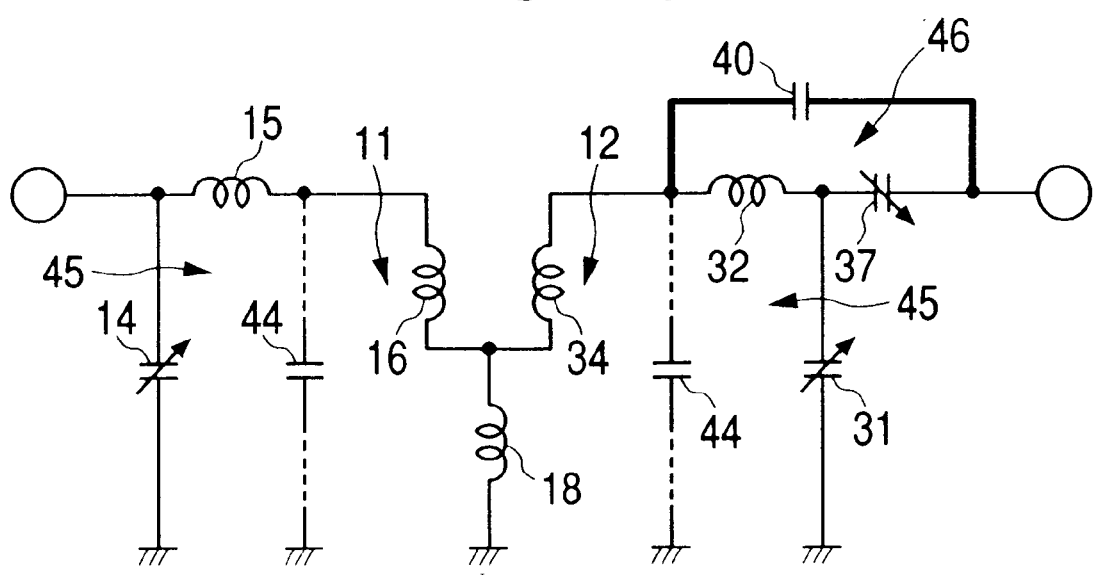
FIG. 3 is a diagram showing an equivalent circuit of the multiple-tuning circuit of a tuner provided by the present invention in a state of low-band reception.

As shown in FIG. 3, due to the existence of a capacitor 44, the varactor diode 14, the tuning coil 15 for high-band reception and the capacitor 44 in the first tuning circuit 11 as well as the varactor diode 31, the tuning coil 32 for high-band reception and the capacitor 44 in the second tuning circuit 12 form a new tuning circuit 45 referred to hereafter as a parasitic tuning circuit separately from the main tuning circuit. The tuning frequency of the parasitic tuning circuit 45 is a frequency all but common to the first tuning circuit 11 and the second tuning circuit 12. When the desired tuning frequency of the main tuning circuit is 127 MHz for example, the tuning frequency of the parasitic tuning circuit 45 appears in an UHF band in the range 600 to 700 MHz.

By providing the capacitor 40, however, the tuning coil 32 for high-band reception, the varactor diode 37 and the capacitor 40 in the secondary tuning circuit 12 form a new tuning circuit 46 referred to hereafter as a trap circuit separately from the main tuning circuit. The capacitances of the capacitor 40 and the varactor diode 31 are set at values equal to those of the capacitor 44 and the varactor diode 37 respectively. In addition, sharing the tuning coil 32 for high-band reception, the trap circuit 46 and the parasitic tuning circuit 45 have tuning frequencies equal to each other.

Figure 4:
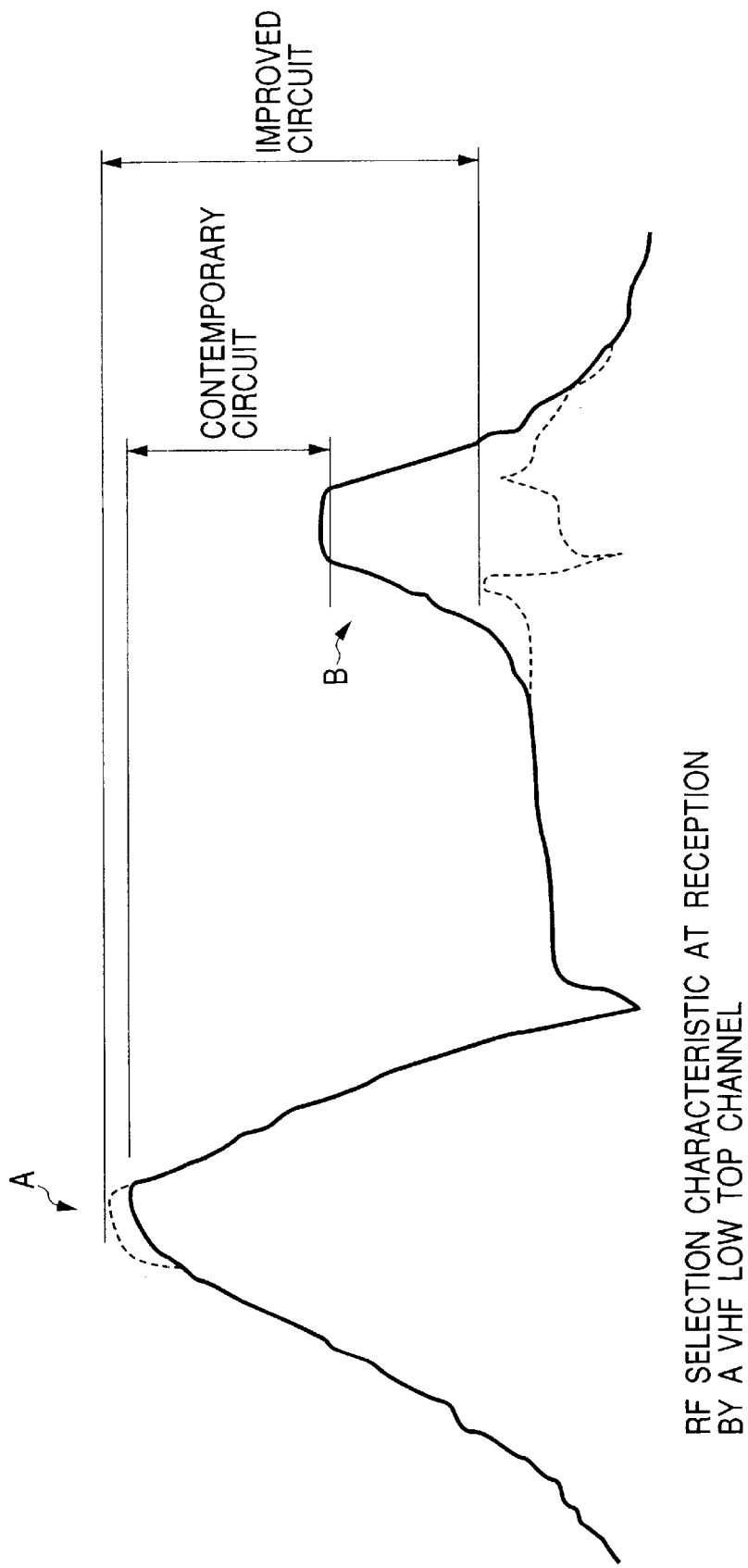
FIG. 4 is a diagram showing a frequency selection characteristic of a multiple-tuning circuit of the conventional tuner and the multiple-tuning circuit of a tuner provided by the present invention in a state of low-band reception.
Figure 5:
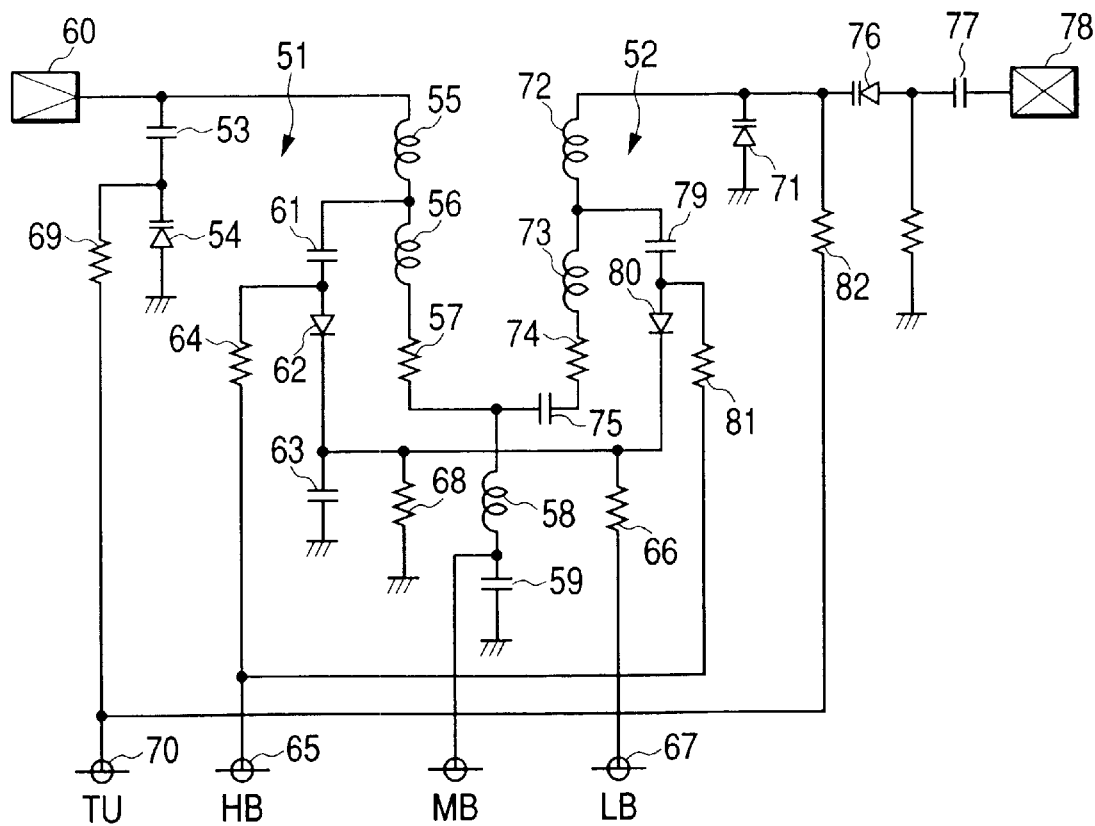
FIG. 5 is a diagram showing the multiple-tuning circuit of the conventional tuner.
Figure 6:
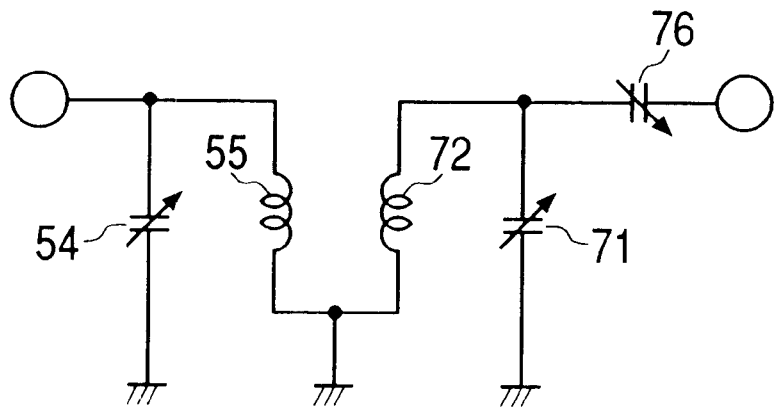
FIG. 6 is a diagram showing an equivalent circuit of the multiple-tuning circuit of the conventional tuner in a state of high-band reception.
Figure 7:
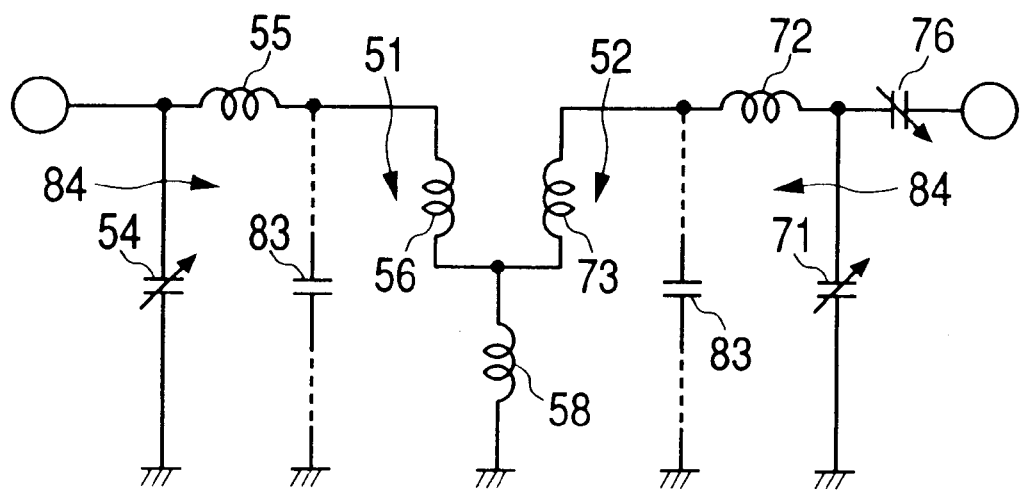
FIG. 7 is a diagram showing an equivalent circuit of the multiple-tuning circuit of the conventional tuner in a state of low-band reception.

Thus, the multiple-tuning circuit in the state of low-band reception exhibits a frequency selection characteristic like one shown by a dashed line in FIG. 4. As shown in that figure, with the main tuning circuit having a tuning frequency of 127 MHz, the peak in the frequency range 600 to 700 MHz generated by the parasitic tuning circuit in the conventional configuration almost disappears. As a result, the mixer 39 (see FIG. 1) does not generate a disturbance signal.

Figure 2:
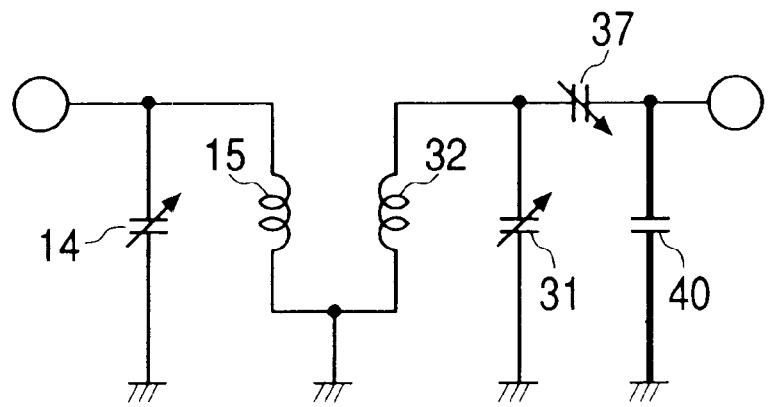
FIG. 2 is a diagram showing an equivalent circuit of the multiple-tuning circuit of a tuner provided by the present invention in a state of high-band reception.

It should be noted that, in the multiple-tuning circuit in the state of high-band reception, a tap effect caused by the varactor diode 37 and the capacitor 40 shown in FIG. 2 raises the Q of the secondary tuning circuit 12, making the frequency selection characteristic curve sharper. As a result, the mixed modulation characteristic is also improved as well.

As described above, in accordance with the present invention, in a state of low-band reception, by newly providing a capacitor, a tuning coil for high-band reception, a varactor diode and the capacitor form a trap circuit. It is thus possible to eliminate a frequency-characteristic peak caused by a parasitic tuning circuit newly formed by a capacitance between terminals of a switch diode in a non-conductive state. As a result, the disturbance to the signal with an immediate frequency can be eliminated.

In addition, in accordance with the present invention, in a state of low-band reception, the newly provided capacitor and the varactor diode result in a tap effect, which raises the Q of the secondary tuning circuit, making the frequency selection characteristic curve sharper. As a result, the mixed modulation characteristic is also improved as well.

Furthermore, in accordance with the present invention, by setting the capacitance of the newly provided at a value about equal to a capacitance between terminals of a switch diode in a non-conductive state, the tuning frequency of the tap circuit can be made equal to that of the parasitic tuning circuit.

What is claimed is:

1. A multiple-tuning circuit of a tuner, the circuit comprising a primary tuning circuit and a secondary tuning circuit wherein:
   the secondary tuning circuit includes:
      a first varactor diode;
      a series circuit of a first coil for high-band reception and a second coil for low-band reception, with the series circuit connected in parallel to the first varactor diode;

a switch diode connected between the ground and a connection point between the first coil and the second coil;

a second varactor diode with an end thereof connected to a connection point between the first coil and the first varactor diode; and a capacitor connected between the other end of the second varactor diode and a connection point between the first coil and the second coil in parallel to a circuit of the second varactor diode and the first coil, the other end of the second varactor diode is used as an output terminal of the multiple-tuning circuit; and the first coil, the second varactor diode and the capacitor provides a trap circuit.

2. A multiple-tuning circuit of a tuner according to claim 1 wherein the capacitance of the capacitor is set at a value about equal to a capacitance between terminals of the switch diode in a non-conductive state.

* * * * *

UNITED STATES PATENT AND TRADEMARK OFFICE
CERTIFICATE OF CORRECTION

PATENT NO. : 6,593,835 B1
DATED : July 15, 2003
INVENTOR(S) : Masaki Yamamoto et al.

It is certified that error appears in the above-identified patent and that said Letters Patent is hereby corrected as shown below:

<u>Title page,</u>
Item [56], References Cited, FOREIGN PATENT DOCUMENTS, delete "10/1987" and substitute -- 10/1997 -- in its place.

Signed and Sealed this

Twentieth Day of January, 2004

JON W. DUDAS
*Acting Director of the United States Patent and Trademark Office*